(12) United States Patent
de Andrade et al.

(10) Patent No.: US 8,963,265 B1
(45) Date of Patent: Feb. 24, 2015

(54) GRAPHENE BASED QUANTUM DETECTOR DEVICE

(75) Inventors: Marclo C. de Andrade, San Diego, CA (US); Anna M. Leese de Escobar, Encinitas, CA (US); David Garmire, Honolulu, HI (US); Nackieb Kamin, Kapolei, HI (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 73 days.

(21) Appl. No.: 13/619,753

(22) Filed: Sep. 14, 2012

(51) Int. Cl.
*H01L 31/028* (2006.01)
*H01L 29/16* (2006.01)

(52) U.S. Cl.
CPC .......... *H01L 29/1606* (2013.01); *H01L 31/028* (2013.01)
USPC ........................................................ 257/431

(58) Field of Classification Search
CPC ........................ H01L 27/14–27/14893; H01L 29/66015–29/66045; H01L 31/00–31/208; H01L 2924/13088; H01L 29/1606
USPC ................................................ 257/413–466
See application file for complete search history.

(56) References Cited

U.S. PATENT DOCUMENTS

| | | | |
|---|---|---|---|
| 7,947,955 B2 * | 5/2011 | Kawano et al. | 250/341.1 |
| 8,604,462 B2 * | 12/2013 | Kim | 257/29 |
| 8,659,009 B2 * | 2/2014 | Ozyilmaz et al. | 257/40 |
| 8,805,148 B2 * | 8/2014 | Avouris et al. | 385/131 |
| 8,878,120 B2 * | 11/2014 | Patil et al. | 250/214.1 |
| 2012/0001761 A1 * | 1/2012 | Voutilainen et al. | 340/600 |
| 2012/0281484 A1 * | 11/2012 | Cho et al. | 365/185.28 |
| 2013/0056708 A1 * | 3/2013 | Kim | 257/30 |
| 2013/0193404 A1 * | 8/2013 | Koppens et al. | 257/9 |
| 2014/0264275 A1 * | 9/2014 | Zhong et al. | 257/21 |
| 2014/0299741 A1 * | 10/2014 | Colli | 250/200 |
| 2014/0319385 A1 * | 10/2014 | Mikhailov | 250/493.1 |

OTHER PUBLICATIONS

R. Hillenbrand, T. Taubner & F. Keilmann "Phonon-Enhanced Light-Matter Interaction at the Nanometre Scale", Nature vol. 418 Jul. 11, 2002.

(Continued)

*Primary Examiner* — Steven J Fulk
*Assistant Examiner* — Eric Ward
(74) *Attorney, Agent, or Firm* — SSC Pacific Patent Office; Arthur K. Samora; Kyle Eppele

(57) ABSTRACT

A graphene based detector device can include a source, a drain, and a gate. The gate can incorporate a discharging element and a graphene sheet that is proximate to the discharging element. The graphene sheet for the transistor can have a decreasing width, from a maximum width $w_2$ distal to the discharging element to a minimum width $w_1$ proximate to the discharging element. An electric potential can be established across graphene sheet, to facilitate funneling of the electrons from the graphene sheet (which are caused by quanta of electromagnetic radiation) toward the discharging element. The devices can be formed in an array to establish an antenna that operates according to the quantum nature of light, as opposed to resonance (wavelength). Multiple graphene layers that are doped using different materials can be included. The multiple layer funnel electrons at specific frequencies, to create an operating frequency range for the device.

11 Claims, 3 Drawing Sheets

(56) References Cited

OTHER PUBLICATIONS

Kin Chung Fong and Keith Schwab, "Graphene Bolometry and Photodetection", presented at the The Center on Functional Engineered Nano Architectonics. May 2011.

A. H. Castro Neto et. al. "The Electronic Properties of Graphene", Reviews of Modern Physics, vol. 81, Jan.-Mar. 2009.

Fengnian Xia, Thomas Mueller, Roksana Golizadeh-mojarad, Marcus Freitag, Yu-ming Lin, James Tsang, Vasili Perebeinos, and Phaedon Avouris, "Photocurrent Imaging and Efficient Photon Detection in a Graphene Transistor", Nano Lett., 2009, 9 (3), pp. 1039-1044.

M. Liu et al., "A Graphene-Based Broadband Optical Modulator," Nature, vol. advance online publication, May. 2011.

Y.-M. Lin, C. Dimitrakopoulos, K. A. Jenkins, D. B. Farmer, H.-Y. Chiu, A. Grill, Ph. Avouris 100-GHz Transistors from Wafer-Scale Epitaxial Graphene, Feb. 5, 2010 vol. 327 Science.

Hwang, Gilgueng et al., "Graphene as Thin Film Infrared Optoelectronic Sensor", French National Agency of Research, NANOROL Project, http://www.isir.upmc.fr/files/isot_09.pdf.

Patel, Prachi, "Detecting Light With Graphene", 2009, http://www.technologyreview.com/computing/23666/?a=f.

Xia, Fengnian et al., "Photocurrent Imaging and Efficient Photon Detection in a Graphene Transistor", American Chemical Society Nano Letters, vol. 9, No. 3, pp. 1039-1044 (2009), http://www.gr-sci.net/papers/nl8033812.pdf.

Toshiba Research Europe Ltd., Cambridge Research Laboratory, http://www.toshiba-europe.com/research/crl/qig/singlephotondetection.html.

* cited by examiner

GRAPHENE BASED QUANTUM DETECTOR DEVICE

FEDERALLY-SPONSORED RESEARCH AND DEVELOPMENT

This invention (Navy Case No. 101319) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-5118; email ssc pac T2@navy.mil.

FIELD OF THE INVENTION

The present invention pertains generally to devices that convert quanta of electromagnetic radiation into an electrical signal. More specifically, the present invention pertains to devices that use graphene to convert quanta of electromagnetic radiation over a wide frequency range into a proportional electrical signal.

BACKGROUND OF THE INVENTION

Ordinary antennas operate on the concept of resonance. For these antennas, the size of the antenna is directly related to the wavelength of the electromagnetic wave it detects. The resonance condition limits substantially the frequency range that an antenna can detect; a reduction in antenna size for lower frequencies operation is similarly limited. Small antennas at high frequencies can use semiconductors and superconductors as RF detectors. However, semiconductors and superconductors have an intrinsic limit of operation to high frequencies.

Antennas that incorporate graphene can achieve operation over a wider band of frequency, which the current technology cannot address. This is because a graphene-based detection device (antenna) can be a photon-based system that detects quanta of electromagnetic radiation (as opposed to detection in a classical electromagnetic sense) and can convert the electromagnetic radiation into a proportionate electrical signal. As such, these devices do not operate under the rules of classical electromagnetism (and be sized according to wavelength considerations), but can be constructed to take advantage of the particle nature (quantum nature) of light. Quantum based detection devices allow for antennas that can be extremely small at low frequencies, when considered in comparison with resonance based antennas that are sized based on wavelength to accommodate the low frequency at which the antenna is designed to operate In view of the above, it is an object of the present invention to provide a device that can convert quanta of incident electromagnetic radiation into an electrical signal. Another object of the present invention is to provide a device that can use the photon nature of incident electromagnetic radiation to convert the radiation into an electrical signal over a wide frequency range. Still another object of the present invention is to provide a semiconductor having structure that converts electromagnetic radiation quanta into an electrical signal, which results in an antenna that can be sized independently of the design frequency range of that antenna when the semiconductor is used as an antenna. Another object of the present invention is to provide a device that can convert quanta of incident electromagnetic radiation into an electrical signal that can be easily manufactured in a cost-effective manner.

SUMMARY OF THE INVENTION

A semiconductor and method for achieving a transistor-like effect in the semiconductor, as well as antenna which incorporates the semiconductor can include a source, a drain, and a gate. The gate can include a discharging element and a graphene sheet that is located between the source and the drain, with the graphene sheet being in direct contract with the discharging element. The transistor can further include an electromagnetic radiation source that is incident on the graphene sheet.

The graphene sheet for the transistor can be formed with a decreasing width, from a maximum width distal to the discharging element to a minimum width proximate to said gate electrode. With this configuration, electrons detected by the graphene detector can be funneled across the graphene sheet towards the discharging element when electromagnetic radiation illuminates the graphene sheet. An electrical field current can be used in conjunction with the graphene sheet. The electrical field current further facilitates funneling of the electrons toward the discharging element during operation of the device. The magnitude of the electrical field can be manipulated to adjust the frequency at which the graphene layer most efficiently converts quanta into an electrical signal.

Additional graphene layers which are made of different graphene materials from the first graphene sheet can be included, to create a filter effect for the transistor. A plurality of transistors according to several embodiments can be formed in an array to establish an antenna with a smaller profile, yet which can take advantage of the quantum nature of light to operate effectively over a much wider frequency range, when compared to an antenna that is constructed to operate over the same frequency range, but that is constructed based on the wave nature of light, i.e., based on a design wavelength range.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

Figure 1:
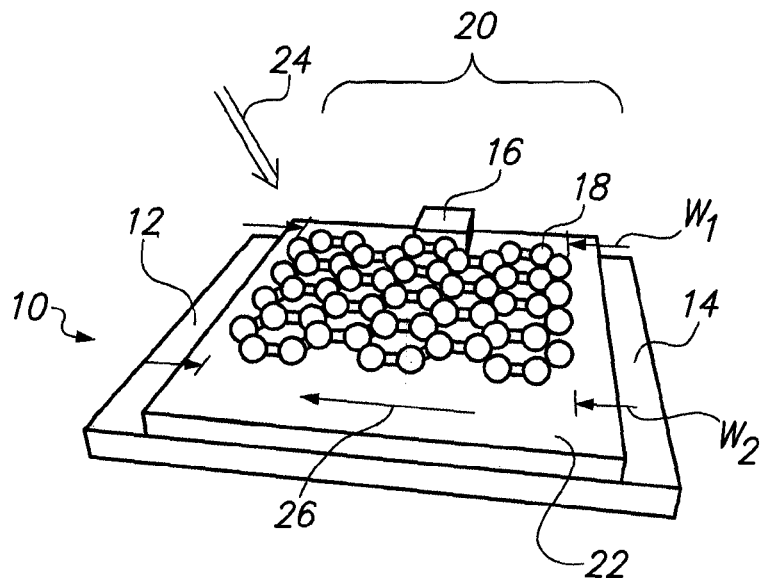
FIG. 1 is a side elevational view of a graphene based quantum detector device according to several embodiments of the present invention.

Referring initially to FIG. 1, a graphene based quantum detector device is shown and is initially designated by reference character 10. As shown, device 10 can be configured in the same manner as a transistor, to include a source 12, a drain 14 and a discharging element 16. A graphene sheet 18 can be included in the device according to several embodiments. Graphene sheet 18 can cooperate with discharging element 16 to function as a gate 20 for the device 10. An insulator layer 22 can separate graphene sheet 18 from source 12 and drain 14.

The material properties of graphene can allow the structure disclosed herein to function as a transistor using the quantum nature of light. Specifically, due to the zero-bandgap nature of graphene, it can be capable of generating conduction electrons from incident electromagnetic radiation over a wide range of frequencies. As a result, an incident photon will push an electron into the conduction band to create an electron-hole pair. When this occurs, the photon imparts energy that is equivalent to $E=hc/\lambda$, where E is the incident photon energy, h is Planck's constant, c is the speed of light and $\lambda$ is the wavelength of the electromagnetic radiation 24 that is incident on graphene sheet 18. The momentum that is created by the generation of the electron hole pair is equivalent to $p=h/\lambda$. In a relatively short amount of time, on the order of ten picoseconds (10 ps) or so, this electron will recombine with the hole making detection difficult without the use of an electric field to separate the electron and hole pair.

By raising the voltage of a layer of graphene, it may be that the crowding and uncrowding of carriers can result in further absorption of light.

A plurality of devices 10 having the structure cited in FIG. 1 can result in an array of transistors where the field effect produced by the graphene sheet 18 can result in a measurable resistance change in the device 10 (which would then be effectively functioning as a field effect transistor, FET). The approach can allow for a continuous query of the charge build-up on the transistor gate 20 (the graphene sheet 18 portion of gate 20). However, without a supplied electric field, it would be difficult to measure the charging and discharging from the photon impacts (10 ps would require highly specialized electronics to detect a photon impact event). Thus, electric field 26 in FIG. 1 is needed.

The electric field 26 shown in FIG. 1 allows for tunneling of the electron onto a discharging element 16 of gate 20. In this manner, the electron cannot recombine. With this configuration, the graphene sheet 18 must be replenished over time as it becomes positively charged. Similarly the discharging element 16 portion of gate 20 of the device 10 has to be re-grounded after each sensing period (this can be accomplished by incorporating additional transistors in a circuit that include device 10). The sensitivity of this method is then determined by how much electric field is generated by the electron $-1.6e^{-19}$ coulombs/($\epsilon A$) where $\epsilon$ is the absolute permittivity that is typically used in capacitors, and A is the area of the capacitor (since the capacitive effect is being provided by graphene sheet 18, A is essentially the area of graphene sheet 18). This result implies that the greatest sensitivity occurs by shrinking the area of the capacitor (as that will generate the largest electric field change). A typical MOSFET with a gate capacitance of five femtoFaradays (5 fF) would have a gate voltage change of thirty-two micro-volts (32 $\mu V$) from one electron.

There can be different ways to generate charges in the graphene sheet. For example, an alternative charging approach could be to supply a source electrode and drain electrode (not shown in FIG. 1) in contact with graphene sheet 18, and measure the resulting photocurrent. Because the contact resistance between graphene and metal is known to be very high, the metal contact with the graphene sheet 18 can actually establish an inherent electric field (energy difference between the metal and graphene conduction electrons).

The patentable aspects of this present invention can include the tunneling of the electrons generated by illumination of graphene sheet 18 with electromagnetic radiation 24 across graphene sheet 18 to the discharging element 16 of the MOSFET (In the present invention disclosure the terms FET and MOSFET are used interchangeably). External electric field 26 can be used in combination with a carefully shaped graphene sheet 18 that can have a geometric configuration with a decreasing taper in width, from a maximum width $w_2$ on graphene sheet 18 distal from discharging element 20 to a minimum width $w_1$ proximate discharging element 20. In the simplest case (shown in FIG. 1), the graphene sheet is used directly and sits above a transistor such that the transistor potential changes when photonic interaction occurs due to illumination for electromagnetic radiation 24. A short spike of conductivity change will then be seen when a photon interaction occurs.

In FIG. 1, a single device 10 that functions as a FET is shown. It can be appreciated, however, that small antennas can use FET's as antennas. Therefore, a plurality of devices 10 can be arranged in an array to function as pixels, and the array of these pixels could be used to give spatial information of the incoming pertaining to the incident electromagnetic radiation 24. Stated differently, a plurality of devices 10 can be arranged to function as an antenna.

Figure 2:
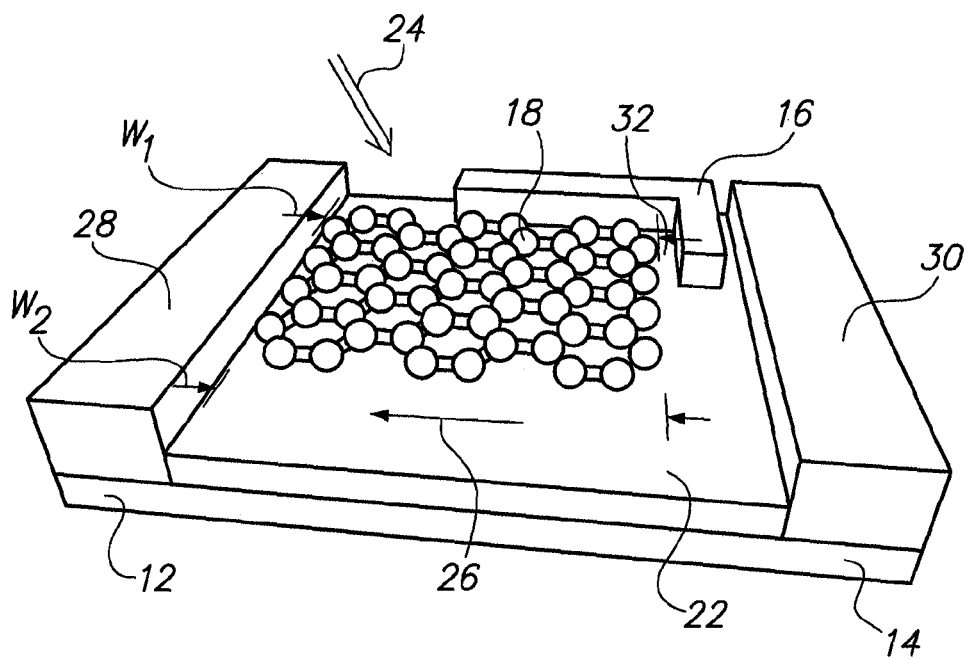
FIG. 2 is a side elevational view of an alternative embodiment of the device of FIG. 1.

In another embodiment, and referring now to FIG. 2, graphene sheet 18 can be located between two rails 28, 30. These rails are metallic contacts and are used to established a potential difference, (either positive or negative) across graphene sheet 18, to allow the simultaneous generation of electric field to separate the holes and carriers produced by the impingement of electromagnetic radiation 24 as described above, and a tunneling element to carry the charge off of the graphene sheet and be collected by discharging element 16. This allows a charge buildup (charge integration) to be used on the resulting charge-sensing transistor. Discharging element 16 can be separated from graphene 18 by a tunneling gap 32, as shown in FIG. 2. The size of tunneling gap 32 can be set according to the desired operating frequency of operation of device 10 that is desired by the user. The dimensions of tunneling gap 32 can be controlled in order to control the energy difference, which results in a device 10 with an embedded frequency selector.

Figure 3:
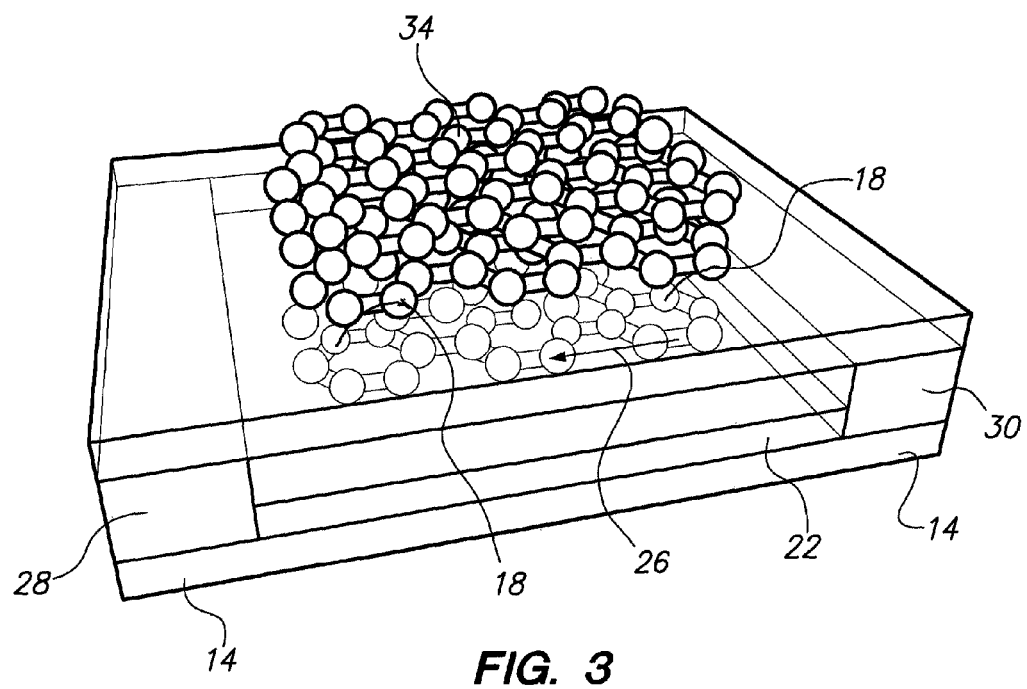
FIG. 3 is a side elevational view of another alternative embodiment of the device of FIG. 1; and, FIG. 4 is a block diagram of steps that can be taken to accomplish the methods according to several embodiments of the present invention.

In still another embodiment, and referring now to FIG. 3, a second layer of graphene 34 can be added. In other words, If instead of a gapless layer of graphene, we can use a bilayer of graphene. Graphene layer 34 can be made of a slightly different material than graphene sheet 18. The graphene bilayer, contrary to the single layer, can have a gap like in a regular semiconductor. It is possible to control the graphene gap by varying properties such as chemical doping. This method can be used to select out a specific band of energy between the bandgap of the top layer and the bandgap of the bottom layer. More specifically, graphene layer 34 and graphene sheet 18 can be doped with different materials such as Boron, Nitrogen, or growing a two- or three-layer form with the layers properly arranged to give the material a band gap, which results different frequencies and frequency ranges of incident electromagnetic radiation 24 at which the aforementioned electron hole pairs are established With this configuration, graphene layer 34 can cooperate with graphene sheet 18 to allow a specific band of energy at a frequency of interest between the bandgap of the top layer (graphene layer 34) and the bandgap of the bottom layer (graphene sheet 18). Stated differently, the operating range of device 10 (and by extension, any pixels and antennae that incorporate device 10) can be manipulated by making graphene layer 34 and graphene sheet 18 of different graphene materials.

Figure 4:
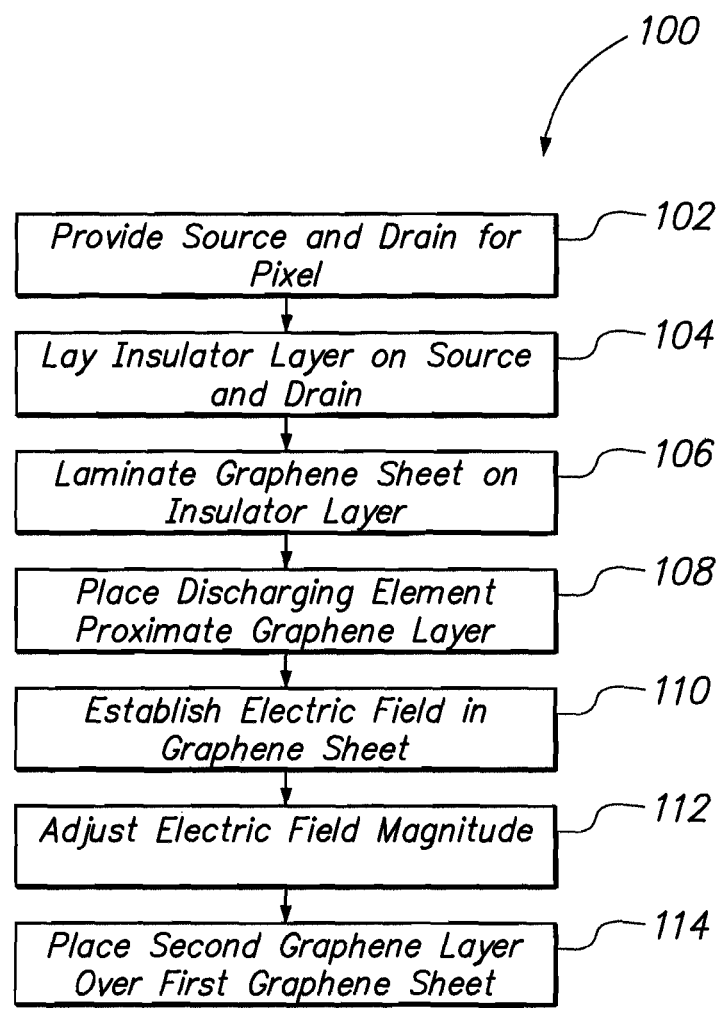

Referring now to FIG. 4, a block diagram 100 that depicts the steps that can be taken to accomplish the methods of the present invention according to several embodiments is shown. As shown in FIG. 4, the methods can include the initial step 102 of providing a source 12 and a drain 14. The methods can further include the step 104 of laying insulator layer 22 over source 12 and drain 1, and laminating a graphene sheet 18 on insulator layer 22, as shown by step 106. The methods can further include the step 108 of providing a discharging element 16 that is proximate graphene sheet 18, so that discharging element 16 and graphene sheet 18 cooperate to form gate 20 for the device 10. An electric field 26 can be placed in electrical contact with graphene sheet 18 so that there is an electrical potential across graphene sheet 18. This step can be shown as block 110 in FIG. 4.

In several embodiments, the methods can further include the step of adjusting the magnitude of the electrical field, as indicated by step 112 in FIG. 4. When the magnitude of electric field 26 is manipulated, the graphene sheet operates as described above at an operating frequency, as desired by the user. When a second graphene layer 34 is placed over graphene sheet 18, as depicted by block 114 in FIG. 4, the graphene layer 34 and graphene sheet 18 can cooperate to establish a frequency band at which the device converts electromagnetic radiation 24 to an electrical signal.

The advantages of device 10 according to several embodiments can be that the device 10 can take advantage of the quantum nature of light, antennas that can be constructed from device 10 would not necessarily need to be designed according to wavelength considerations. For many low frequency applications, low frequency operation requires very large electronic mean free paths and high electronic mobilities. These traits are two unique characteristics of graphene and particularly for the graphene sheet 18 for the device 10 according to several embodiments. For example, an Unmanned Aerial Vehicle (UAV) antenna that is designed based on resonance principles (sized according to wavelength) could only be capable of operating in the high frequency (HF) range, due to size constraints. If the antenna is constructed using devices 10 that have the graphene sheet 18 according to several embodiments of the present invention, the frequency range of the antenna having the same size could be extended to the low frequency (LF) range.

Another possible variation of device 10 is to replace the tunneling mechanism by a charge-transfer mechanism (such as creating a junction through appropriate doping between the graphene detection material and the charge sensing device). If the energy levels could be pushed to a sufficiently high level (into the visible or near infrared), the stacked elements could be used as a multijunction solar cell.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A transistor, comprising:
   a source;
   a drain;
   a gate, said gate including a discharging element and a graphene sheet located between said source and said drain, said graphene sheet in direct contact with said discharging element, said graphene sheet having a substantially zero bandgap, said graphene sheet further receiving incident radiation which impinges on said graphene sheet;
   said incident radiation freeing electrons in said graphene due to said zero bandgap;
   an electrical field in electrical communication with said graphene sheet, to prevent said electrons from recombining with said graphene sheet; and,
   said graphene sheet having a width with a decreasing taper, from a maximum width distal to said discharging element to a minimum width proximate to said discharging element, to allow said electrons to move towards said discharging element.

2. The transistor of claim 1 further comprising an electromagnetic radiation source incident on said graphene sheet.

3. The transistor of claim 1, wherein said transistor has an operating frequency range, and said electrical field current has a magnitude, and further wherein said magnitude is adjusted according to a desired said operating frequency range.

4. The transistor of claim 1 wherein said graphene sheet is made of a first graphene material, and further comprising a second layer of graphene that is made of a second graphene material, said second layer of graphene being placed over said graphene sheet.

5. The transistor of claim 1, further comprising an insulator layer disposed between said graphene sheet and said source, and further between said graphene sheet and said drain.

6. A method for achieving a transistor effect in a pixel from incident electromagnetic radiation, said method comprising the steps of:
   A) providing a source and a drain for said pixel;
   B) laying an insulator layer on said source and said drain;
   C) laminating at least one graphene layer on said insulator layer so that said graphene layer has a tapered width, from a maximum width to a minimum width;
   D) providing a discharging element in direct contact with said minimum width of said graphene layer;
   E) illuminating said graphene layer with incident radiation to free electrons from said graphene layer;
   F) establishing an electric field in said graphene sheet, to prevent said electrons from said step E) from recombining with said graphene layer, so that said electrons within said graphene sheet move towards said discharging element.

7. The method of claim 6, wherein said electric field current has a magnitude and said method has a desired operating frequency, and further comprising the step of:
F) adjusting said magnitude according to said desired operating frequency.

8. The method of claim 6, where said graphene sheet is made of a first graphene material, and further comprising the step of:
G) placing a second layer of graphene placed over said graphene sheet, said second graphene layer being made of a second graphene material.

9. An antenna comprising a plurality of semiconductors, each said semiconductor comprising:
a source;
a drain;
a gate, said gate including a discharging element and a graphene sheet located between said source and said drain, said graphene sheet having a tapering width from a maximum width distal to said discharging element to a minimum width proximate to said gate electrode, said minimum width of said graphene sheet-in direct contract with said discharging element said graphene sheet having a substantially zero bandgap, said graphene sheet further receiving incident radiation which impinges on said graphene sheet;
said incident radiation freeing electrons in said graphene sheet due to said zero bandgap; and,
an electrical field in electrical communication with said graphene sheet, wherein said electric field prevents said electrons from said incident radiation from recombining with said graphene sheet, allowing said electrons to move within said graphene sheet and towards said discharging element.

10. The antenna of claim 9 wherein said graphene sheet is made of a first graphene material, and further comprising:
a second layer of graphene that is made of a second graphene material, said graph layer being placed over said graphene sheet.

11. The antenna of claim 10, further comprising an insulating layer placed between said graphene sheet and said source, and also between said graphene sheet and said drain.

* * * * *